United States Patent
Wu et al.

(10) Patent No.: US 8,362,571 B1
(45) Date of Patent: Jan. 29, 2013

(54) HIGH COMPRESSIVE STRESS CARBON LINERS FOR MOS DEVICES

(75) Inventors: Qingguo Wu, Vancouver, WA (US); James S. Sims, Tigard, OR (US); Mandyam Sriram, Beaverton, OR (US); Seshasayee Varadarajan, Lake Oswego, OR (US); Haiying Fu, Camas, WA (US); Pramod Subramonium, Salem, OR (US); Jon Henri, West Linn, OR (US); Sirish Reddy, Hillsboro, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 13/016,660

(22) Filed: Jan. 28, 2011

Related U.S. Application Data

(62) Division of application No. 12/134,969, filed on Jun. 6, 2008, now Pat. No. 7,906,817.

(51) Int. Cl.
*H01L 21/02* (2006.01)

(52) U.S. Cl. ........ 257/384; 438/758; 438/761; 438/778; 438/783

(58) Field of Classification Search .................... 257/384
See application file for complete search history.

(56) References Cited

U.S. PATENT DOCUMENTS

| | | | |
|---|---|---|---|
| 5,470,661 A | 11/1995 | Bailey et al. | |
| 5,877,095 A | 3/1999 | Tamura et al. | |
| 5,965,216 A * | 10/1999 | Neuberger et al. | 427/577 |
| 5,976,990 A | 11/1999 | Mercaldi et al. | |
| 7,109,098 B1 * | 9/2006 | Ramaswamy et al. | 438/513 |
| 7,214,630 B1 * | 5/2007 | Varadarajan et al. | 438/778 |
| 7,247,582 B2 | 7/2007 | Stern et al. | |
| 7,327,001 B1 * | 2/2008 | Singhal et al. | 257/377 |
| 7,371,634 B2 | 5/2008 | Chiang et al. | |
| 7,381,451 B1 | 6/2008 | Lang et al. | |
| 7,396,718 B2 | 7/2008 | Frohberg et al. | |
| 7,482,245 B1 | 1/2009 | Yu et al. | |
| 7,566,655 B2 | 7/2009 | Balseanu et al. | |
| 7,662,730 B2 * | 2/2010 | Chen et al. | 438/791 |
| 7,820,556 B2 * | 10/2010 | Hsu et al. | 438/758 |
| 7,906,817 B1 | 3/2011 | Wu et al. | |
| 7,998,881 B1 | 8/2011 | Wu et al. | |
| 8,026,573 B2 * | 9/2011 | Kuo et al. | 257/529 |
| 2002/0076918 A1 | 6/2002 | Han et al. | |
| 2006/0024879 A1 | 2/2006 | Fu et al. | |
| 2006/0185591 A1 | 8/2006 | Muralidharan et al. | |
| 2006/0202278 A1 * | 9/2006 | Shima et al. | 257/369 |

(Continued)

FOREIGN PATENT DOCUMENTS

WO 2007/043206 4/2007

OTHER PUBLICATIONS

Varadarajan et al., "Tensile dielectric films using UV curing", U.S. Appl. No. 10/972,084, filed Oct. 22, 2004.

(Continued)

*Primary Examiner* — N Drew Richards
*Assistant Examiner* — Ankush Singal
(74) *Attorney, Agent, or Firm* — Weaver Austin Villeneuve & Sampson LLP

(57) ABSTRACT

Transistor architectures and fabrication processes generate channel strain without adversely impacting the efficiency of the transistor fabrication process while preserving the material quality and enhancing the performance of the resulting transistor. Transistor strain is generated is PMOS devices using a highly compressive post-salicide amorphous carbon capping layer applied as a blanket over on at least the source and drain regions. The stress from this capping layer is uniaxially transferred to the PMOS channel through the source-drain regions to create compressive strain in PMOS channel.

17 Claims, 9 Drawing Sheets

U.S. PATENT DOCUMENTS

| | | |
|---|---|---|
| 2007/0032024 A1 | 2/2007 | Peidous et al. |
| 2007/0105292 A1 | 5/2007 | Chen et al. |
| 2007/0132054 A1 | 6/2007 | Arghavani et al. |
| 2007/0200179 A1 | 8/2007 | Chen |
| 2007/0287240 A1 | 12/2007 | Chen et al. |
| 2008/0020591 A1 | 1/2008 | Balseanu et al. |
| 2008/0292798 A1 | 11/2008 | Huh et al. |
| 2009/0017640 A1 | 1/2009 | Huh et al. |
| 2009/0039475 A1 | 2/2009 | Shioya |
| 2009/0250762 A1 | 10/2009 | Liu et al. |
| 2009/0263972 A1 | 10/2009 | Balseanu et al. |
| 2011/0244694 A1 | 10/2011 | Antonelli et al. |

OTHER PUBLICATIONS

Varadarajan et al., "Use of VHF RF plasma to deposit high tensile stress films with improved film properties for use in strained silicon technology", U.S. Appl. No. 11/975,473, filed Oct. 18, 2007.

Varadarajan et al., "Development of high stress SiN films fur use with strained silicon technologies", Proc. 68$^{th}$ Symp. On Semiconductors and IC Tech., Kyoto 2005.

P. Morin et al., "Tensile contact etch stop layer for nMOS performance enhancement: influence of the film morphology", ECS meeting, May 2005.

Takagi et al., "High Rate Deposition of a-Si:H and a-SiN$_x$:H by VHF PECVD", Vacuum, 51, 1998.

Smith, D.L et al., "Mechanism of SiN$_3$-SiH$_4$ Llasma", J. Electrochem. Soc., vol. 137 (Feb. 1990).

Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.

U.S. Appl. No. 11/975,473, Office Action mailed Oct. 28, 2008.

U.S. Appl. No. 11/975,473, Office Action mailed Mar. 23, 2009.

Jiang et al., "Tensile dielectric films using UV curing", U.S. Appl. No. 11/899,683, filed Sep. 7, 2007.

U.S. Appl. No. 11/899,683, Office Action mailed May 29, 2009.

Arghavani, R. et al., "Strain Engineering in Non-Volatile Memories", Semiconductor International, Apr. 1, 2006.

Wu et al., "Method for Making High Stress Boron Carbide Films", U.S. Appl. No. 12/116,889, filed May 7, 2008.

Tan, Kian-Ming et al., "A New Liner Stressor with Very High Intrinsic Stress (>6GPa) and Low Permittivity Comprising Diamond-Like Carbon (DLC) for Strained P-Channel Transistors", 2007 IEEE, pp. 127-130.

Pascual, E. et al., "Boron carbide thin films deposited by tuned-substrate RF magnetron sputtering", Diamond and Related Materials 8, (1999) pp. 402-405.

Wu et al., "Method for Making High Stress Boron-Doped Carbon Films", U.S. Appl. No. 12/134,961, filed Jun. 6, 2008.

Wu et al., "Method for Making High Stress Amorphous Carbon Films", U.S. Appl. No. 12/134,969, filed Jun. 6, 2008.

U.S. Appl. No. 11/975,473, Office Action mailed Oct. 9, 2009.

U.S. Appl. No. 11/899,683, Office Action mailed Feb. 8, 2010.

U.S. Appl. No. 12/134,969, Office Action mailed Feb. 9, 2010.

Raveh, A. et al., "Deposition and properties of diamondlike carbon films produced in microwave and radio-frequency plasma", J. Vac. Sci, Technol. A: Vacuum, Surfaces, and Films, Publication Date: Jul. 1992, pp. 1723-1727.

U.S. Appl. No. 11/975,473, Office Action mailed Mar. 25, 2010.

Takagi et al., "High Rate Deposition of a-SiN$_x$:H by VHF PECVD", Mat. Res. Soc. Symp. Proc. vol. 467, 1997, Materials Research Society.

U.S. Appl. No. 12/116,889, Office Action mailed Apr. 5, 2010.

Piazza, F. and Grambole, D. and Schneider, D. and Casiraghi, C., and Ferrari, A.C. and Robertson, J. (2005) *Protective diamond-like carbon coatings for future optical storage disks* Diamond and Related Materials, 14 (3-7). pp. 994-999.

B. Kleinsorge, A. Ilie, M. Chinowalla, W. Fukarek, W.I. Milne, J. Robertson (1998) *Electrical and optical properties of boronated tetrahedrally bonded amorphous carbon (ta-C:B)*, Diamond and Related Materials, (Jul. 1998) pp. 472-476.

U.S. Appl. No. 12/134,969, Office Action mailed Jun. 10, 2010.

U.S. Appl. No. 12/134,961, Office Action mailed Sep. 22, 2010.

U.S. Appl. No. 11/975,473, Office Action mailed Nov. 1, 2010.

U.S. Appl. No. 12/134,969, Notice of Allowance mailed Nov. 18, 2010.

U.S. Appl. No. 12/134,969, Allowed Claims.

U.S. Appl. No. 12/116,889, Office Action mailed Jan. 18, 2011.

Tan, Kian-Ming et al., *A High-Stress Liner Comprising Diamond-Like Carbon (DLC) for Strained p-Channel Mosfet*, IEEE Electron Device Letters, vol. 29, No. 2, Feb. 2008.

Xu, Shi et al., *Properties of carbon ion deposited tetrahedral amorphous carbon films as a function of ion energy*, J. Appl. Phys. 79 (9) (1996) American Institute of Physics.

WO patent application No. PCT/US2011/029662, International Search Report and Written Opinion mailed Oct. 11, 2011.

Reinke, P. et al., "Hydrogen-plasma etching of ion beam deposited c-BN films: An in situ investigation of the surface with electron spectroscopy," Journal of Applied Physics, vol. 88, No. 10, pp. 5597-5604, Nov. 15, 2000.

U.S. Appl. No. 12/750,180, Office Action mailed Jul. 6, 2012.

U.S. Appl. No. 12/134,961, Office Action mailed Mar. 10, 2011.

U.S. Appl. No. 12/116,889, Office Action mailed Jun. 23, 2011.

U.S. Appl. No. 13/177,450, "Method for making high stress boron-doped carbon films", Wu et al., filed Jul. 6, 2011.

U.S. Appl. No. 12/134,961, Notice of Allowance mailed Jun. 13, 2011.

Xu, Shi, et al., *Properties of carbon ion deposited tetrahedral amorphous carbon films as a function of ion energy*, J. Appl. Phys. 79 (9) (1996) American Institute of Physics.

Tan, Kian-Ming, et al. "A New Liner Stressor with Very High Intrinsic Stress (>6GPa) and Low Permittivity Comprising Diamond-Like Carbon (DLC) for Strained P-Channel Transistors," 2007 IEEE, pp. 127-130.

Pascual, E. et al., "Boron carbide thin films deposited by tuned-substrate RF magnetron sputtering," Diamond and Related Materials 8, (1999) 402-405.

Yu et al., "Stress Profile Modulation in STI Gap Fill," Novellus Systems, Inc., U.S. Appl. No. 11/471,958, filed Jun. 20, 2006.

Wu et al., "Method for Making High Stress Boron Carbide Films," Novellus Systems, Inc., U.S. Appl. No. 12/116,889, filed May 7, 2008.

Wu et al., "Method for Making High Stress Amorphous Carbon Films," Novellus Systems, Inc., U.S. Appl. No. 12/134,969, filed Jun. 6, 2008.

\* cited by examiner

HIGH COMPRESSIVE STRESS CARBON LINERS FOR MOS DEVICES

CROSS REFERENCE TO RELATED APPLICATIONS

This application is a divisional of U.S. patent application Ser. No. 12/134,969, filed on Jun. 6, 2008, and entitled "High Compressive Stress Carbon Liners for MOS Devices", which is incorporated herein by reference in its entirety.

FIELD OF THE INVENTION

This invention relates to electronic devices and associated fabrication processes. More specifically, the invention relates to strained transistor architecture for PMOS devices in which a highly compressive amorphous carbon capping layer is provided on at least the source and drain regions to induce compressive strain in the PMOS channel region.

BACKGROUND OF THE INVENTION

Semiconductor processing involves forming transistors on wafers. A transistor typically includes a gate dielectric and a gate electrode, a source and a drain, and a channel region between the source and the drain. In Complimentary Metal Oxide Semiconductor (CMOS) technology, transistors may typically be of two types: Negative Channel Metal Oxide Semiconductor (NMOS) and Positive Channel Metal Oxide Semiconductor (PMOS) transistors. The transistors and other devices may be interconnected to form integrated circuits (ICs) which perform numerous useful functions.

The speed of a Metal Oxide Semiconductor Field Effect Transistor (MOSFET) depends primarily on electron—in the case of NMOS—or hole—in the case of PMOS—mobility in the channel region between the source and the drain. In general, mobility is a measure of hole or electron scattering in a semiconductor. Increasing mobility can have a profound benefit for digital electronic devices allowing faster switching and lower power consumption. Therefore, methods of increasing electron and hole mobility in transistors have been a major focus.

One solution to increase transistor speed is to strain the silicon in the channel. Compressing the channel region in PMOS transistors is particularly important because hole mobility in PMOS transistors is much less than electron mobility in NMOS transistors due to the higher effective mass of holes.

Compressing the silicon lattice distorts its physical symmetry as well as its electronic symmetry. The lowest energy level of the conduction band is split, with two of the six original states dropping to a lower energy level and four rising to a higher energy level. This renders it more difficult for the holes to be 'scattered' between the lowest energy states by a phonon, because there are only two states to occupy. Whenever holes scatter, their motion is randomized. Reducing scatter increases the average distance a hole can travel before it is knocked off course, increasing its average velocity in the conduction direction. Also, distorting the lattice through compressive strain can distort the hole-lattice interaction in a way that reduces the hole's effective mass, a measure of how much it will accelerate in a given field. As a result, hole transport properties, like mobility and velocity, are improved and channel drive current for a given device design is increased in a strained silicon channel, leading to improved transistor performance.

Compressive nitrides have been used to improve performance of PMOS transistors. For example, silicone nitride (SiN) combined with hydrogen atoms have been reported to reach compressive stresses of close to 3 GPa. Note that compressive stress is presented as an absolute value that simplifies comparison of this property for various films. In general, controlling N—H, Si—H, and Si—N bond ratios currently allows developing films with up to 3.0 GPa compressive stress. However, compressive nitrides still can not meet requirements of future transistor generations where higher hole mobility (i.e. more compression in the channel region) are needed. Moreover, many compressive nitrides require annealing at elevated temperatures for prolonged time significantly impacting thermal budgets of transistors.

Silicone Germanium (SiGe) has also been used to strain the channel region. SiGe can be grown as an epitaxial layer into pre-etched silicon-based source and drain regions. Since SiGe lattice is larger than silicon lattice by about 4%, compressive stress is created in the channel regions. Compressive stresses of approximately 1 GPa have been reported, resulting in a 35% increase in current flow in PMOS transistors. However, because strain builds up asymmetrically in a SiG/Si stack, the maximum permissible stack height is typically no more than 50 nm limiting the overall stress level.

Amorphous carbon exhibit many attractive properties for thin film applications in semiconductors and other devices. (F. Piazza et al, Diamond Relat. Mater. 14, 994-999 (2005); B. Kleinsorge et al, Diamond Relat. Mater. 7, 472-476 (1998)). One such property is post-deposition residual compressive stress that can be used to strain the channel in PMOS transistor architecture. However, available deposition methods require high ion energy, such as 100 eV and above, that may be damaging to device. Bailey et al. (U.S. Pat. No. 5,470,661) and Neuberger et al. (U.S. Pat. No. 5,965,216) disclosed low temperature deposition of amorphous carbon films (also referred to as a diamond-like carbon (DLC) film) using plasma-enhanced chemical vapor deposition from hydrocarbon/helium plasma. The method disclosed using an acetylene precursor diluted in helium resulting in 1.5 GPa compressive films. Such compressive stresses are not sufficient for new generation transistors.

Overall, higher compressive stresses, especially higher than 3.0 GPa and using regular PECVD with low ion energy such as 1-3 eV are desired for PMOS transistors. Accordingly, new transistor architectures and fabrication processes for generating channel strain are needed.

SUMMARY OF THE INVENTION

The present invention addresses this need by providing transistor architectures and fabrication processes for generating high channel strains without adversely impacting the efficiency of the transistor fabrication process while preserving the material quality and enhancing the performance of the resulting transistor. Transistor strain is generated in PMOS devices using a highly compressive amorphous carbon capping layer at least over salicide on the transistor's source and drain regions, which provides for compressive stress of greater than 3.0 GPa.

In one aspect, the invention relates to a method of fabricating a strained transistor structure. The method involves providing a PMOS transistor structure with a substrate, a conductive gate separated from the substrate by a gate dielectric, source and drain regions in the substrate on either side of the gate, and a channel region underlying the gate. A layer of salicide is formed on at least the source and drain regions of the PMOS transistor. A highly compressive liner is then formed over the salicide layer. The compressive liner may have residual compressive stress of at least about 3.5 GPa. In other embodiments, the compressive stress may exceed 5.0 GPa.

The deposition and treatment processes are preferably conducted using a dual-frequency PECVD process. In one embodiment, the PECVD apparatus may include a low frequency (LF) RF generator and a high frequency (HF) RF generator. Typically, the HF generator operates at power levels greater than the LF generator.

Various carbon containing precursors can be used. In one embodiment, the carbon containing precursors may include saturated carbon species. For example, methane can be used. The deposited film contains essentially very low concentration of hydrogen. It is believed that hydrogen relaxes the strained amorphous carbon lattice structure. As a result a film has lower density structure and exhibits lower compressive stress. Various methods known in the art may be implemented to reduce hydrogen content within the compressive film.

The chamber pressure may be between about 0.5 and 6 Torr, while the temperature of the substrate may be less than 425° C., in one embodiment less than 380° C.

These and other aspects and advantages of the invention are described further below and with reference to the drawings.

DETAILED DESCRIPTION OF THE INVENTION

Reference will now be made in details to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention relates to an improved strained transistor architecture and fabrication technique. The architecture has been developed for 90 nm logic technology on 200 mm wafers, although it is not so limited in application. Channel strain is generated in PMOS devices using a highly compressive post-salicide amorphous carbon capping layer over the source and drain regions and the conductive gate. The stress from this capping layer is uniaxially transferred to the PMOS channel through the source-drain regions to create compressive strain in the PMOS channel. The compressive stress induced in the channel region has been shown to increase the saturation drive current.

To simplify terminology and overall understanding of the present invention, the compressive stress is expressed in absolute values. Such nomenclature allows to compare compressive stress valued without confusion of stress direction. For example, compressive stress of 3.0 GPa is said to be greater than compressive stress of 2.0 GPa. It is well understood in the art that compressive stress and tensile stress are opposite in direction. Sometimes tensile stress is expressed as a positive value, while compressive stress as a negative value. However such expression may lead to confusion when comparing compressive properties of various films since greater compressive stresses will have smaller algebraic values. For example, statement that "−3.0 GPa compressive stress is greater than −2.0 GPa compressive stress" may be misleading from at least mathematical standpoint. Since the present invention describes primarily compressive stress expressions, absolute values are used through out the specification. However, FIGS. 3-7 indicate compressive stress values and their respective direction (i.e., negative values are used). Additionally, compressive stresses are expressed in Giga Pascal (GPa) units, wherein 1 GPa corresponds to 1E10 dynes/cm$^2$.

PMOS Device

Figure 1A:
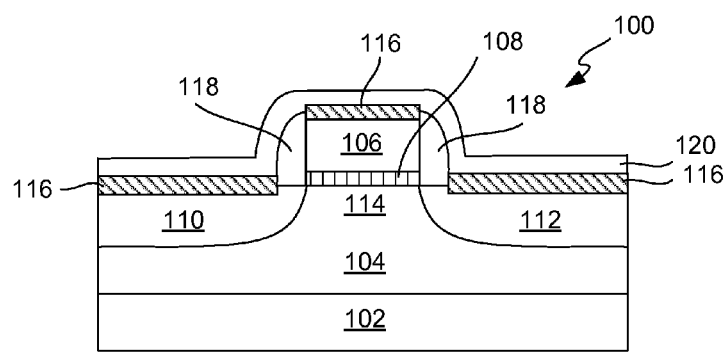
FIG. 1A depicts a simple PMOS transistor architecture in accordance with an embodiment of the present invention with a compressive film deposited over the entire surface of the PMOS transistor.

FIG. 1A illustrates a simple PMOS transistor architecture in accordance with a preferred embodiment of the present invention. The PMOS transistor 100 is typically composed of a p-doped substrate 102 and an n-doped well 104 within the substrate 102, which are typically a part of an overall wafer substrate together with other transistors and devices. The p-doped substrate 102 may include any suitable p-type dopants, such as boron and indium, and may be formed by any suitable technique. The n-doped well 104 may include any suitable n-type dopants, such as phosphorus and arsenic, and may be formed by any suitable technique. For example, the n-doped well 104 may be formed by doping the substrate 102 by ion implantation.

The transistor further includes a conductive gate electrode 106 that is separated from the n-doped well 104 by a gate dielectric 108. The gate electrode 106 may include any suitable material. In one embodiment, the gate electrode 106 may be polysilicon. In another embodiment, gate electrode 106 may include polysilicon doped with a p-type dopant, such as boron. Typically, the gate dielectric 108 is deposited in the form of silicone dioxide, but other, for example high-k, gate dielectric materials can be also selected, such as hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate.

The PMOS transistor 100 also includes p-doped source 110 and drain 112 regions in the n-doped well 104. The source 110 and drain 112 regions are located on each side of the gate 106 forming a channel 114 within the well 104. In one embodiment, the source 110 and drain 112 regions may provide a compressive strain themselves on the channel 114 effectively acting as stressors. For example, SiGe can be incorporated into the source 110 and drain 112 regions. The source 110 and drain 112 regions may also be epitaxial and can have a greater lattice spacing constant than the n-doped well 104 and the channel 114. Greater lattice spacing may provide additional compressive strain on the channel 114. The source 110 and drain 112 regions may include a p-type dopant, such as boron. Additionally, the source 110 and drain 112 regions may be formed in recesses of the n-doped well 104. The transistor may also include sidewall spacers 116 along the sidewalls of the gate 106. Spacers may include any suitable dielectric materials, such as a nitride or an oxide. In one embodiment of this invention, the width of sidewall spacers 118 is substantially increased in comparison with typical dimensions of the PMOS transistor. The increased width of the spacers 118 may additionally enhance the compressive stress of the channel 114.

In one embodiment, the source 110 and drain 112 regions and the gate 106 are covered with a layer of self-aligned silicide (salicide) 114. The general manufacturing steps for fabricating PMOS transistors and salicide layers are well-known in the art. Typically, a layer of cobalt metal is deposited as a blanket and thermally treated to form self-aligning cobalt salicide portions 114. Alternatively, nickel or other refractory metals, such as tungsten, titanium, and palladium, and are suitable for forming salicide portions 116.

In accordance with one embodiment of the invention, a compressive amorphous carbon layer 120 covers as a blanket film the entire surface of the PMOS transistor 100. A typical thickness of the dielectric capping layer can range from 5 to 150 nm. In accordance with the invention, the stress from the compressive amorphous carbon layer 120 is axially transferred to the PMOS channel 114 through the source 110 and drain 112 regions as well as the salicide 116 to create compressive stress in the channel 114. The compressive stress in the channel 114 improves the hole mobility between through the source 110 and drain 112 regions.

The amorphous carbon capping layer 120 is formed on the salicide 116 and spacers 118 by a technique that does not require a temperature of greater than 425° C. A typical deposition time may be 30 seconds to 5 minutes. However, the deposition duration could be also shorter for faster deposition rates and/or thinner films or longer for slower deposition rates and/or thicker films. This helps to avoid thermal degradation of the salicide 116 during the deposition of the capping layer 120. As a result, the resistivity of the salicide 116 in the final transistor 100 remains substantially as on deposition, and the overall thermal budget of the PMOS transistor is substantially preserved.

Figure 1B:
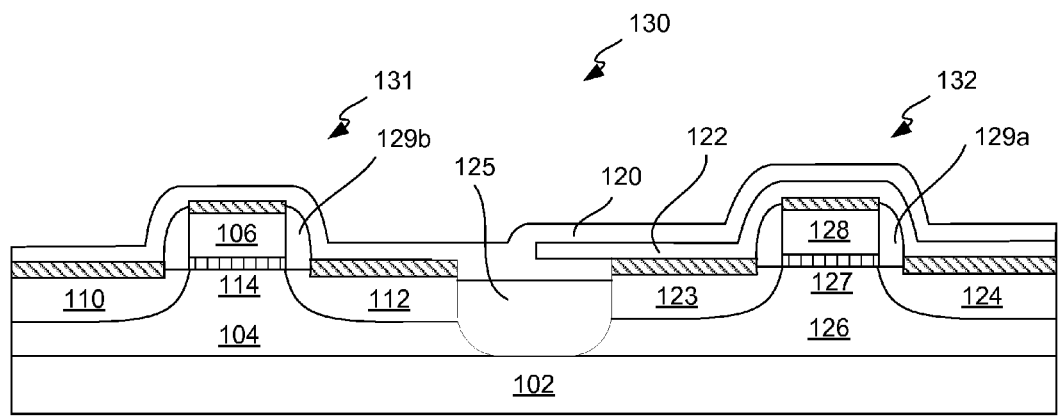
FIG. 1B depicts a simple CMOS transistor architecture in accordance with an embodiment of the present invention with the compressive film deposited over the entire surface of the CMOS transistor and separated from the NMOS region by another film.

FIG. 1B illustrates a simple CMOS transistor architecture in accordance with one embodiment of the present invention. The CMOS transistor 130 typically includes a PMOS transistor 131 and a NMOS transistor 132. The two transistors may share a common p-doped substrate 102. The structure of the PMOS transistor 131 is similar to that illustrated and described with reference to FIG. 1A. The NMOS transistor 132 may include a p-doped well 126 and n-doped source 123 and drain 124 regions. The p-doped well 126 may include any suitable p-type material dopants, such as boron and indium, and may be formed by any suitable technique. The n-doped source 123 and drain 124 regions may include any suitable n-type dopants, such as phosphorus and arsenic, and may be formed by any suitable technique, such as ion implantation or epitaxial deposition. A channel 127 is between the source 123 and drain regions 124. The NMOS transistor also includes a gate 128. The PMOS transistor 131 and the NMOS transistor 132 may be separated by a trench 125.

In one embodiment, the CMOS transistor 130 may have a tensile film 122 over the NMOS transistor 132. For example, the tensile film 122 may be first deposited over the entire surface of the CMOS transistor 130 and then etched away from the PMOS transistor 131 surface. The tensile film 122 may include a variety of materials having tensile properties, such as silicon nitride, silicon oxynitride and others. The tensile film 122 may include a variety of post-deposition treatments, such as removing H from the deposited tensile film 122. A compressive film 120 may be then deposited over the tensile film 122 and the PMOS transistor 131 surface. The performance of the overall CMOS transistor 130 may be optimized by applying compressive stress to the channel 114 of the PMOS transistor 131 to improve hole mobility and, at the same time, preserving tensile stress to the channel 127 of the NMOS transistor to improve electron mobility. It should be readily apparent to one skilled in the art that the order of the tensile film 122 and the compressive film 120 depositions can be reversed. For example, a blanket of a compressive film may be deposited over the entire CMOS transistor surface and then etched away from the NMOS region. Then, a blanket of a tensile film is deposited over the entire CMOS transistor surface. In one embodiment of this invention, the width of sidewall spacers 129b in the PMOS transistor 131 is substantially increased in comparison with typical dimensions of the PMOS transistor. The increased width of the spacer may additionally enhance the compressive stress of the channel 114. In the same or another embodiment, the width of sidewall spacers 129b in the NMOS transistor 132 is substantially decreased in comparison with typical dimensions of the NMOS transistor. The increased width of the spacer may additionally enhance the tensile stress of the channel 127.

Figure 1C:
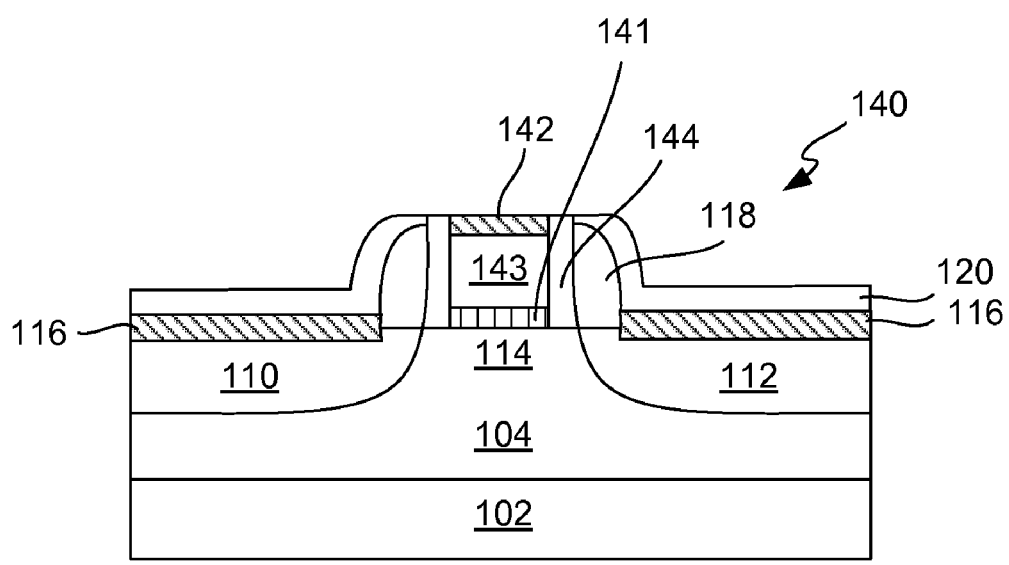
FIG. 1C depicts a simple PMOS transistor architecture in accordance with an embodiment of the present invention with the compressive film removed from the gate region.

Referring to FIG. 1C, in another embodiment, a portion of the compressive film 120 above the gate 143 is removed from above to expose the gate 143 and the salicide 142. The portion of the compressive layer 120 may be removed by a planarization technique, such as chemical mechanical polishing (CMP). In an embodiment, the gate 143, the gate dielectric 141 and the salicide 141 may be partially removed to form trenches 144. The removal may be by a selective etching technique. The trenches then are filled with any suitable material, such as boron carbide, tungsten, molybdenum, rhodium, vanadium, platinum, ruthenium, beryllium, palladium, cobalt, titanium, nickel, copper, tin, aluminum, lead, zinc, alloys of these metals, or their silicides.

Process Steps

Figure 2:
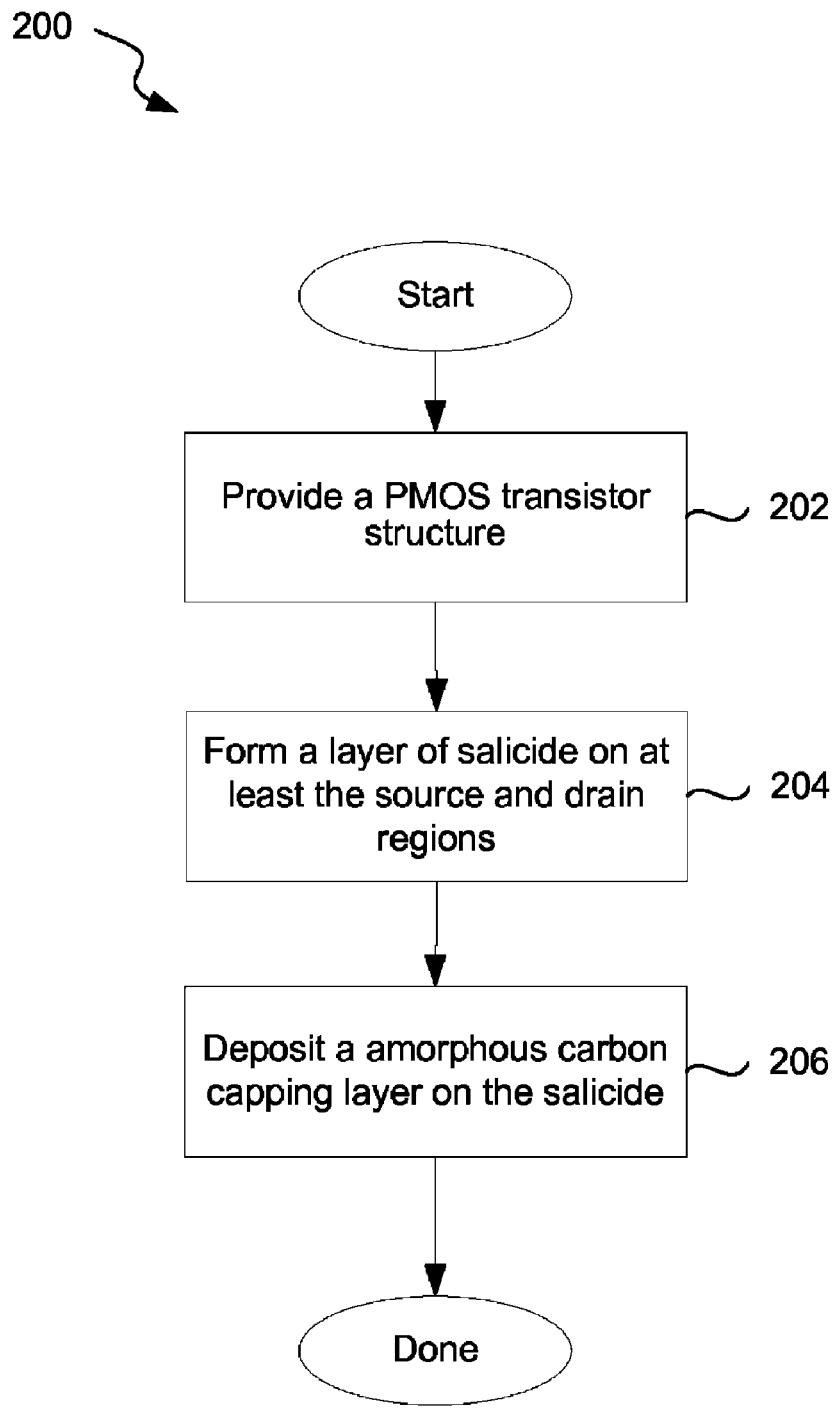
FIG. 2 depicts important stages in a process flow for a method of fabricating a strained transistor structure in accordance with an embodiment of the present invention.

FIG. 2 depicts important stages in a process flow for a method of fabricating a strained transistor structure in accordance with an embodiment of the present invention. The method 200 involves providing a PMOS transistor structure 202, the PMOS transistor structure having a substrate, a conductive gate separated from the substrate by a gate dielectric, source and drain regions in the well on either side of the gate, and a channel region underlying the gate. A layer of salicide is formed on at least the source and drain regions 204. A highly compressive amorphous carbon capping layer is then formed on the salicide overlying the source and drain regions. The capping layer is formed by depositing amorphous carbon on the salicide of at least the source and drain regions 206. The process 206 includes flowing a deposition reactant mixture containing carbon atoms into a vacuum chamber and applying both High Frequency (HF) and Low Frequency (LF) RF power to the chamber to generate a deposition plasma. Using a combination of HF and LF provides higher compressive stress.

Dual-frequency PECVD process utilizes HF energy directed to the precursors and LF energy applied to either the precursors or the substrate. The necessary energy for the chemical reaction is not introduced by heating the whole reaction chamber but just by heated gas or plasma. The thermal budget of the devices stays low with PECVD. The RF generators form the plasma that contains reactive ions and radicals. The RF energy also induces a negative DC self-bias voltage of the substrate resulting in a useful ion bombardment effect.

PECVD generally allows better control of the properties of deposited films, such as compressive stress and hydrogen content, because more process parameters can be varied. With respect to dual frequency PECVD, the independent control of LF and HF generators allows even more sensitive refinement of reaction conditions and results.

Depositing a thin film over a salicide layer in a transistor structure presents a set of challenges. Salicides are easily degradable at high temperature resulting in substantial limitations to the thermal budget of transistor manufacturing. Conventional anneal temperature of about 600° C. may degrade a salicide underlying the capping layer increasing its resistivity to unacceptable levels. Lower temperature may be used, for example, one in which the substrate temperature does not exceed 425° C. However, the duration of a deposition process at that temperature that is necessary to obtain the benefit (e.g., 2 hours) is not economically viable. In addition, low substrate temperature during deposition may prevent damaging of device.

Performance of PMOS devices has been improved using nitrides, such as SiN combined with hydrogen atoms, or SiGe epitaxial layers over pre-etched source and drain regions. However, the highest compressive stress reported is about 2 GPa. Since PMOS transistors are inherently disadvantaged in comparison to NMOS transistors because of holes are less mobile than electrons because higher effective mass of holes. Amorphous carbon structures are able to achieve compressive stresses in excess of 3.0 GPa. Moreover, the deposition of amorphous carbon may be performed at relatively low temperature preserving integrity of other transistor components, such as salicides. In one embodiment, the temperature of the substrate during the deposition could be about 380° C.

Figure 3A:
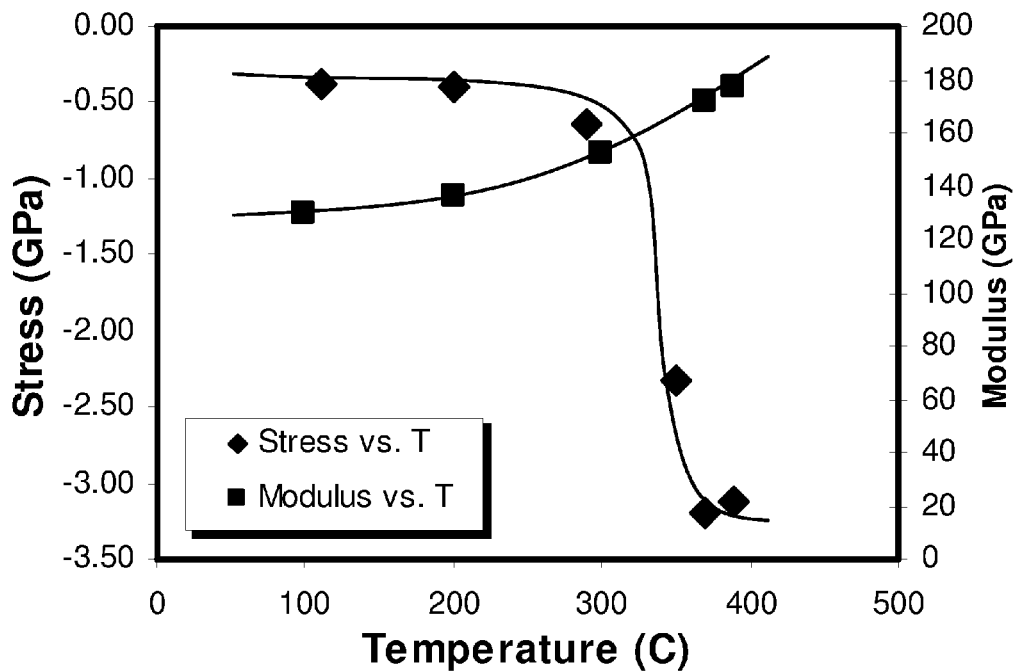
FIG. 3A is a plot of the residual film stress and Young's modulus as a function of the temperature of the wafer substrate.

Referring to FIG. 3A, the compressive stress values and the Young's modulus values for amorphous carbon films are plotted relative to the wafer pedestal temperatures. Below 300° C. the compressive stress does not exhibit substantial variation with temperature. However, the compressive stress increases significantly from less than 1.0 GPa at approximately 300° C. to over 3.0 GPa at above 380° C. Without being restricted to any particular theory, it is believed that carbon-to-carbon bonding changes from $sp^2$ to $sp^3$ in this temperature range. More rigid and strained amorphous carbon structure exists at higher temperatures. Similarly, Young's modulus increases with temperature. It is believed that higher temperature results in increased cross-linking within the film associated with carbon-to-carbon bonding changes from $sp^2$ to $sp^3$. However, Young's modulus does not exhibit substantial jumps with temperature similar to compressive stresses. Instead, Young's modulus demonstrated gradual exponential growth from about 130 GPa at 100° C. to about 180 GPa at approximately 400° C.

Figure 3B:
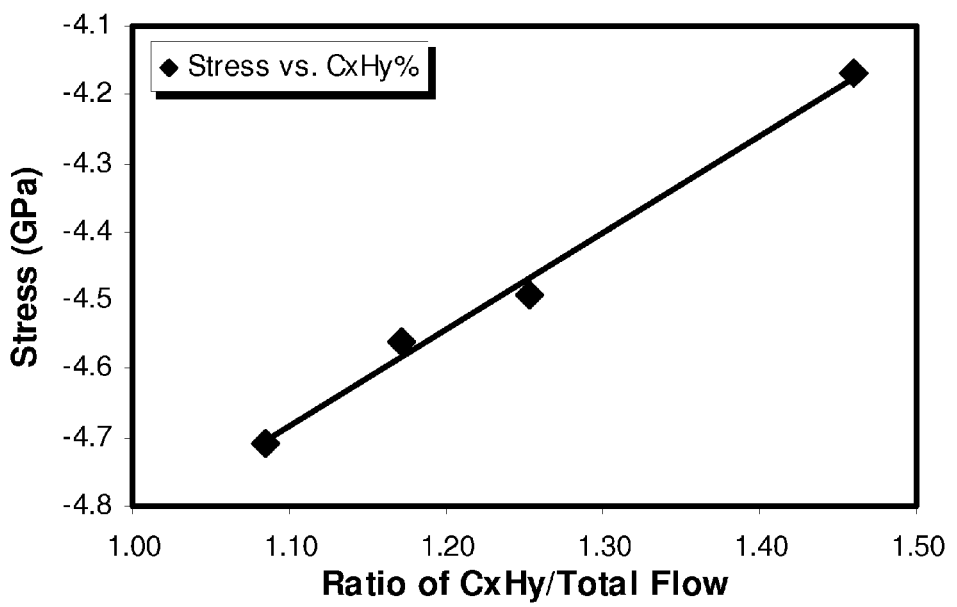
FIG. 3B illustrates the residual film stress as a function of the percent ratio of the methane flow rate to the total flow rate in the process chamber.

Referring to FIG. 3B, the compressive stress of the amorphous carbon capping layer is plotted relative to the ratio of the methane flow rate to the total gas flow rate. The plot indicates that low percent concentration of methane in the total process gases results in compressive stress as high as 4.7 GPa. Without being limited to any particular theory, it is believed that the low concentration of methane results in greater dissociation of C—H bonds leading to more cross-linked structure of the deposited amorphous carbon film. Reducing concentration of methane to less than 1.1% in total process gas flow results in compressive stresses of about 4.7 GPa. However, increasing the concentration of methane to about 1.45% leads to reduction of compressive stress to about 4.2 GPa. The plot indicates essentially linear dependence of compressive stress on concentration of the methane. Other carbon containing precursors will exhibit similar behavior. Compressive stress of greater than 5.0 GPa is possible with selected process conditions.

Figure 4A:
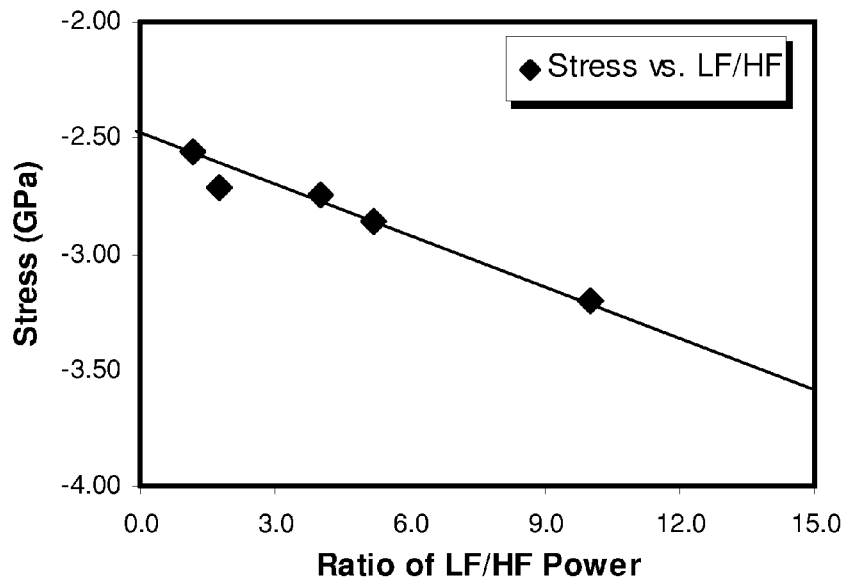
FIG. 4A is a plot of the residual film stress as a function of the ratio of the LF generator power level to the HF generator power level.
Figure 4B:
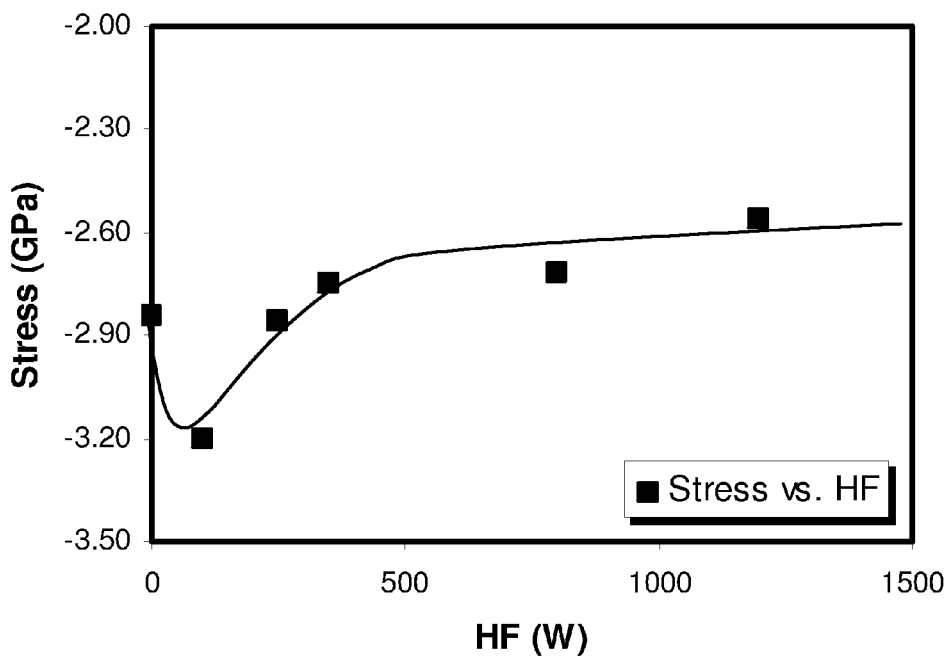
FIG. 4B is a plot of the residual film stress as a function of the HF generator power level.

FIG. 4A illustrates the compressive stress values for amorphous carbon films as a function of the ratio of the LF generator power levels to the HF generator power levels. Increasing power output of the LF generator relative to the HF generator provides for higher compressive stresses in the deposited films. For example, the same power level from both generators results in amorphous carbon film with approximately 2.5 GPa residual stress. When the power of the HF generator was set at ten times the power of the LF generator, the compressive stress of the deposited film increased to approximately 3.25 GPa. Without being restricted to any particular theory, it is believed that the power at low frequencies stimulates higher cross-linking within the film. Referring to FIG. 4B, the residual film stress is plotted as a function of the HF power. The compressive stress generally decreases with increasing the HF power. However, turning off the HF generator leads to a sudden drop in the compressive stresses. Therefore, it is desirable to operate the HF generator at low power setting, such as 100 W.

Figure 5A:
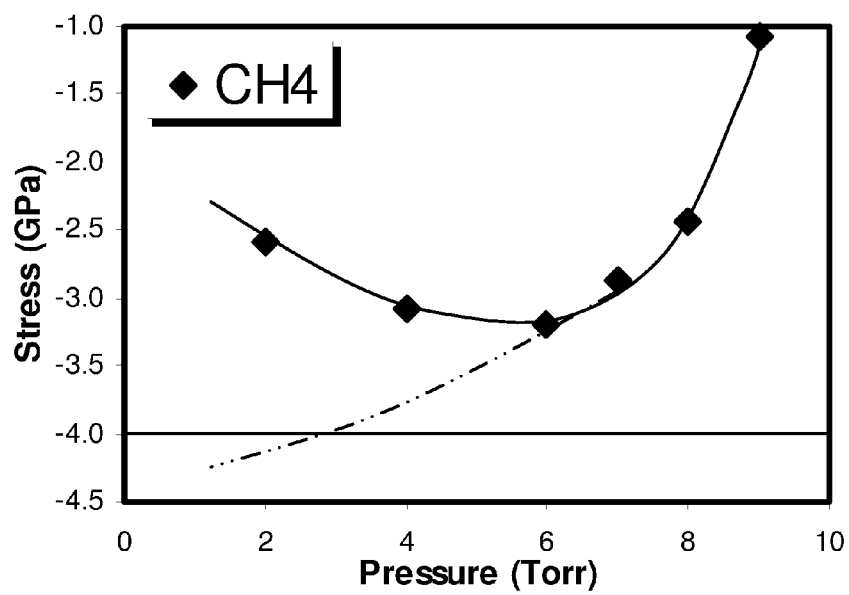
FIG. 5A is a plot of the residual film stress deposited using a methane precursor as a function of the pressure in the chamber.
Figure 5B:
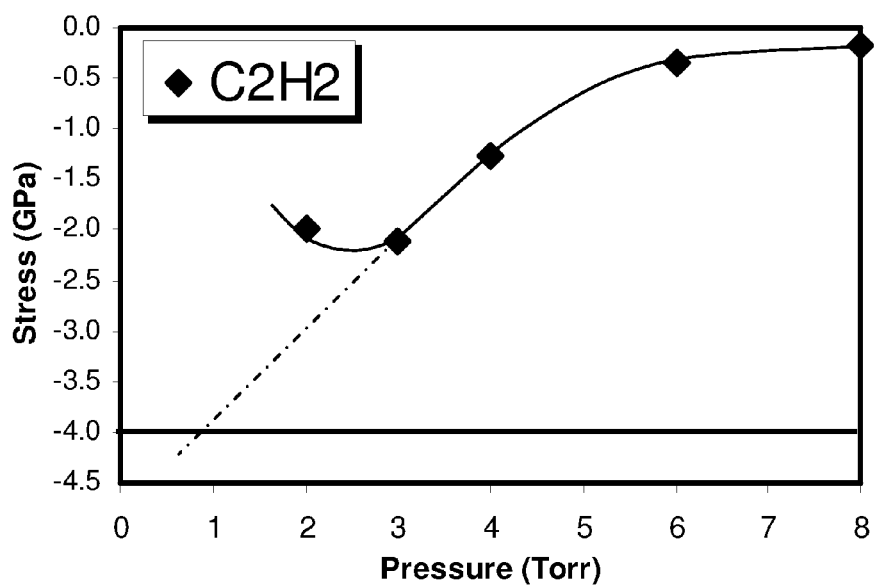
FIG. 5B is a plot of the residual film stress deposited using an acetylene precursor as a function of the pressure in the chamber.

Referring to FIG. 5A, the residual stress for films deposited using a methane precursor is plotted as a function of the chamber pressure. Lower processing pressure results in greater average ion energy, which is inverse proportional to the square root of pressure. Similarly, FIG. 5B illustrates the compressive stress for films deposited using an acetylene precursor at various chamber pressures. The stress generally decreases with increasing of the pressure. However, for very low pressures (less than 6 Torr for the methane precursor and less than 3 Torr for the acetylene precursor) the power density drops below the optimal level resulting in lower compressive stress. It was observed that the large amount of plasma has been distributed outside of the shower head and to the side of the wafer pedestal inside the process chamber at low pressures. Application of bias voltage of −100 to −500V to the wafer substrate and using magnetic filed may confine and direct plasma to the target location even at these low pressure settings.

Figure 6A:
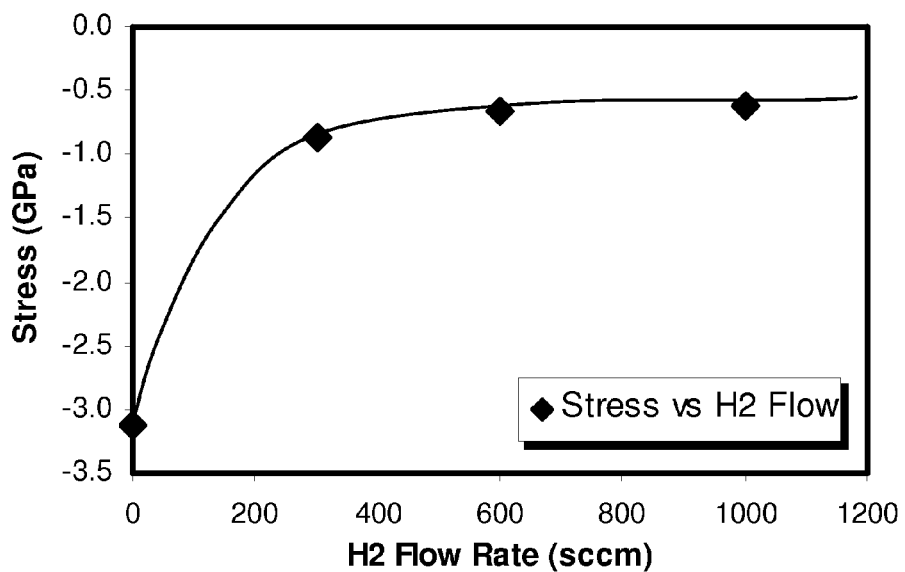
FIG. 6A is a plot of the residual film stress as a function of the hydrogen flow rates.
Figure 6B:
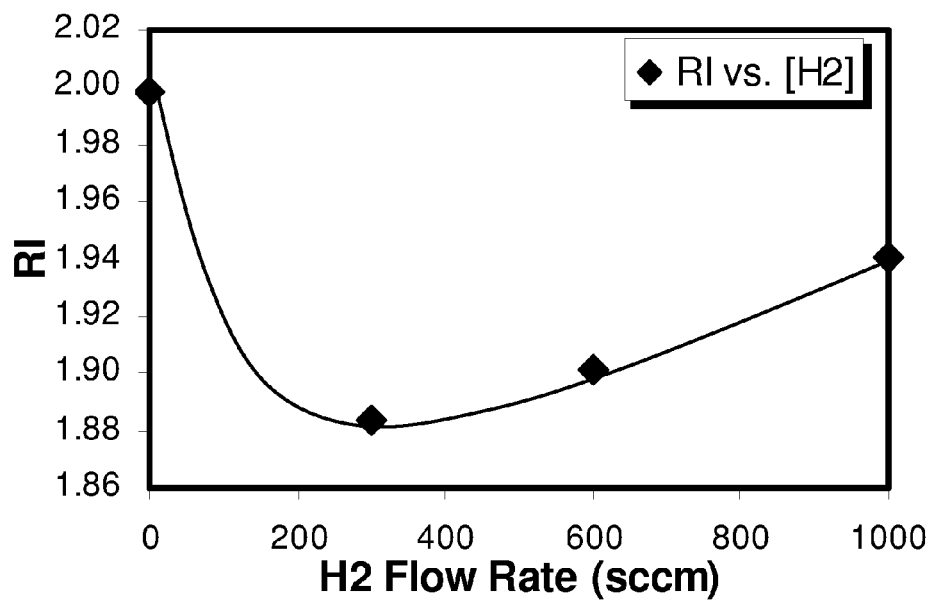
FIG. 6B is a plot of the reflective index as a function of the hydrogen flow rates.

FIG. 6A illustrates a plot of the compressive stress relative to the hydrogen flow rate. The highest compressive stress was achieved when no hydrogen gas was used in the process. Introducing small amount of hydrogen into the process chamber decreases the compressive stress rapidly. The drop in compressive stress starts leveling at approximately 300 sccm and continues to drop at only moderate rates. Similarly, FIG. 6B illustrates the reflective index of amorphous carbon films deposited using different hydrogen flow rates. The reflective index first drops sharply from 2.0 to approximately 1.88 when hydrogen introduced at flow rates. Without being restricted to a particular theory, it is believed that the density of the amorphous carbon film decreases as more hydrogen is flown during the process. Increase the hydrogen flow to above 300 sccm starts to increase the values of the reflective index even though the compressive stress continues to drop in this region.

Figure 7A:
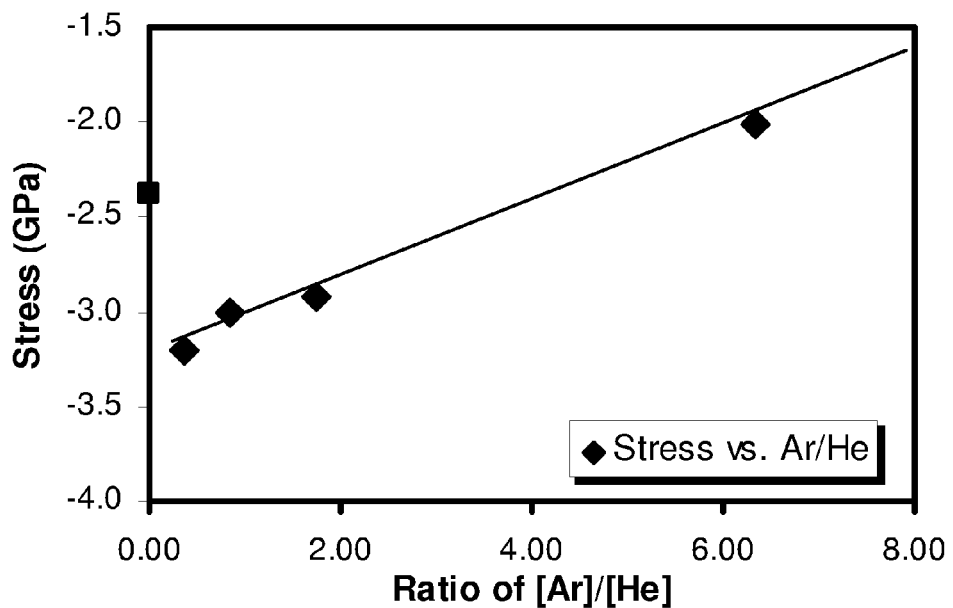
FIG. 7A is a plot of the residual film stress as a function of the ratio of the argon flow rate to the helium flow rate.
Figure 7B:
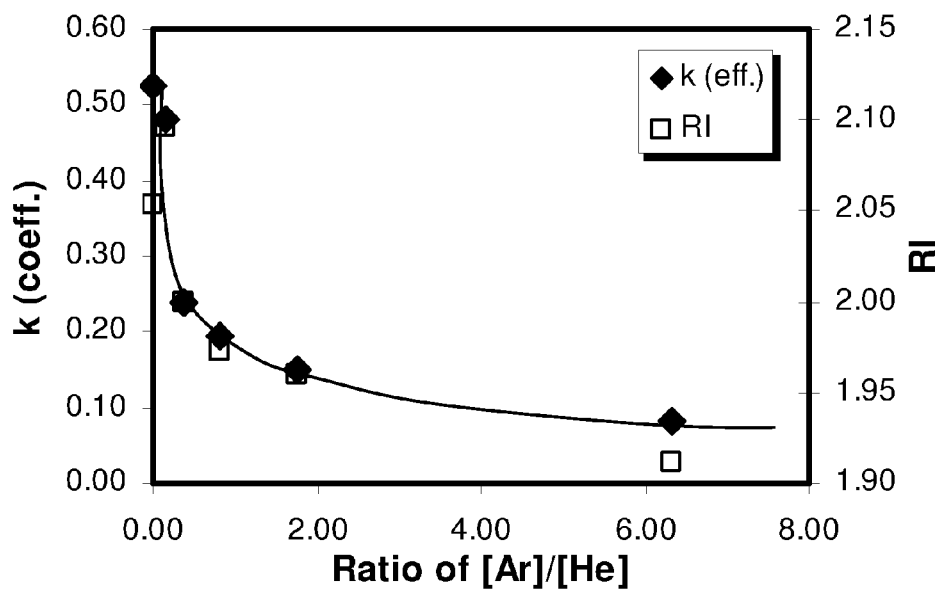
FIG. 7B is a plot of the reflective index and extinction coefficient as a function of the ratio of the argon flow rate to the helium flow rate.

FIG. 7A is a plot of the compressive stress as a function of the ratio of argon flow rates to the helium flow rates. Initial introduction of argon into the helium stream allows for initial increase in compressive stress. For example, adding approximately 27% of argon into the inert gas stream (argon to helium flow rates ratio of approximately 0.375) helps to increase the compressive stress from about 2.4 GPa to about 3.2 GPa. This is illustrated by the lowest point on the plot. However, additional helium in the inert gas stream decreases the compressive properties of the deposited film. FIG. 7B illustrates the values of the extinction coefficient (k) and the reflective index (RI) for the deposited amorphous carbon films for various inert gas compositions. The reflective index profile generally corresponds to the compressive stress profile. However, the extinction coefficient profile does not experience the initial spike when argon is introduced into the inert gas stream.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing amorphous carbon capping layer deposition and treatment is transferred from one station to another within the reactor during the process. While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ or Sequel™ reactor, produced by Novellus Systems of San Jose, Calif., may be used to implement the invention.

Figure 8:
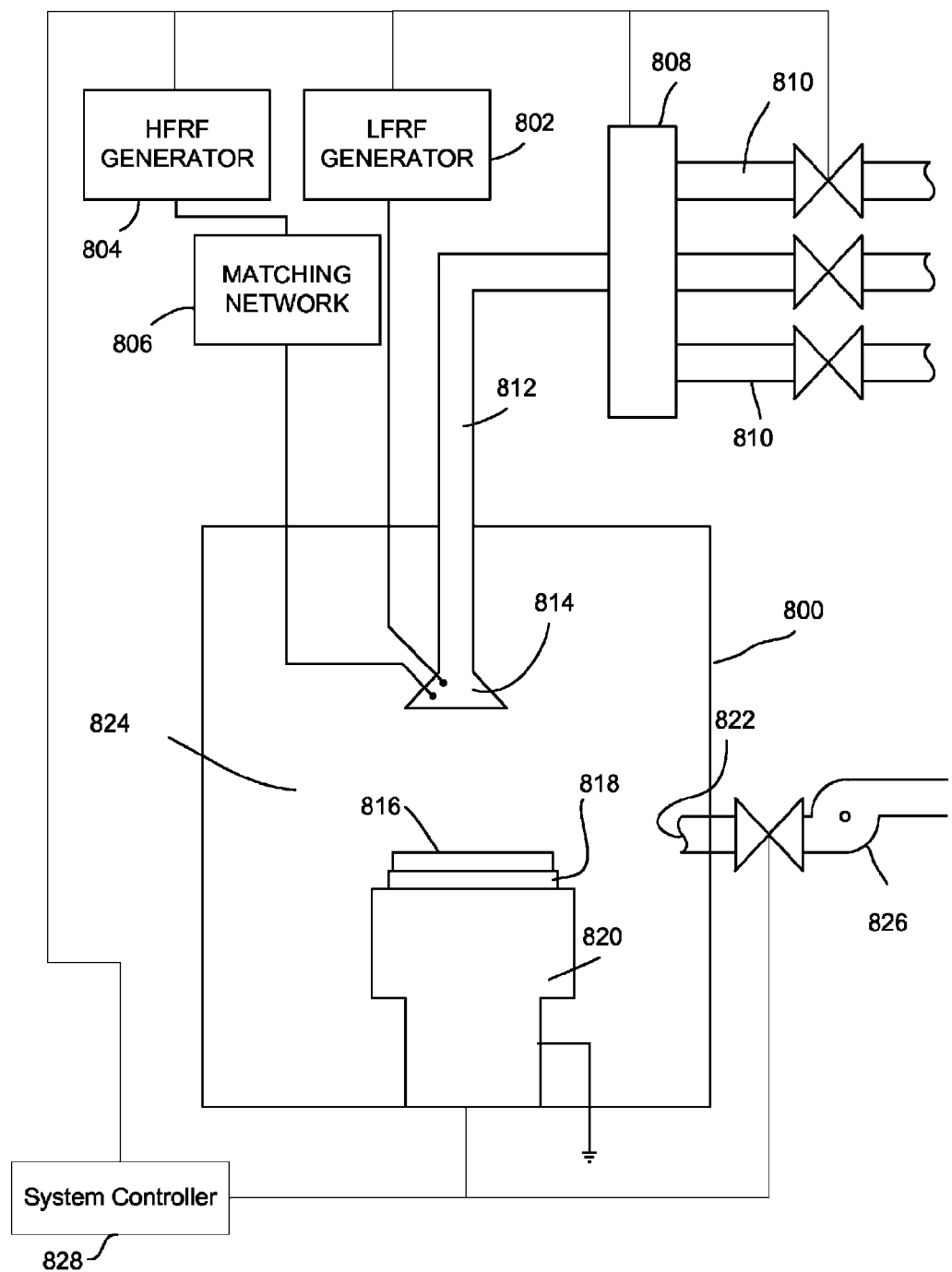
FIG. 8 is a simple block diagram depicting various reactor components arranged for implementing the present invention.

FIG. 8 provides a simple block diagram depicting various reactor components arranged for implementing the present invention. As shown, a reactor 800 includes a process chamber 824, which encloses other components of the reactor and serves to contain the plasma generated by a capacitor type system including a showerhead 814 working in conjunction with a grounded heater block 820. A high-frequency (HF) RF generator 802, connected to a matching network 806, and a low-frequency (LF) RF generator 804 are connected to showerhead 814. In an alternative embodiment, the LF generator 804 can be connected to or located below a wafer pedestal 818. The power and frequency supplied by matching network 806 is sufficient to generate a plasma from the process gas/vapor. In the implementation of the present invention both the HF generator and the LF generator are used. In a typical process, the HF generator is operated generally at frequencies between 2-100 MHz; in a preferred embodiment at 13.56 MHz. The LF generator is operated generally between 50-800 kHz; in a preferred embodiment at 350-600 kHz.

The description of the apparatus and respective process parameters listed here are valid for a Novellus Sequel™ module having six stations to deposit amorphous carbon on 200 mm wafer. The process parameters may be scaled based on the chamber volume, wafer size, and other factors. For example, power outputs of LF and HF generators are typically directly proportional to the deposition surface area of the wafer. The power used on 300 mm wafer will generally be 2.25 higher than the power used for 200 mm wafer. Similarly, the flow rates, such as standard vapor pressure, will depend on the free volume of the vacuum chamber.

In a typical process, the HF generator produces 50-1000 W; in a preferred embodiment 50-500 W. The LF generator produces 200-2000 W; in a preferred embodiment 200-1000 W. The power level of the LF generator is greater than the power level of the HF generator. In one embodiment, the LF power level is at least two times greater than the HF power level. In another embodiment, the LF power level is at least three times greater than the HF power level. The bias voltage on the substrate is 0 to −1000 V; in a preferred embodiment −100 V to −600 V.

The flow rate for the carbon containing precursor may be 50-2000 sccm. In a preferred embodiment where the carbon containing precursor includes methane and acetylene and has the flow rate of 100-1000 sccm. The carbon containing precursor may be one or a combination of the following compounds: methane, ethane, propane, butane, isobutane, neopentane, hexane, ethene (ethylene), propene, butene, pentene, hexene, ethyne (acetylene), propyne, butyne, pentyne, and hexyne. In a preferred embodiment the carbon containing precursor is one or a mixture of saturated hydrocarbons, such as methane, ethane, and propane. The inert gases may be helium, neon, argon, xenon, hydrogen, nitrogen, or any other gas that is not reactive under the process conditions. In a preferred embodiment the carbon containing precursor is one or a mixture of helium and argon.

Within the reactor, a wafer pedestal 818 supports a substrate 816 on which a highly compressive dielectric capping layer in accordance with the invention is to be deposited. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research. The wafer pedestal 818 is functionally coupled with a grounded heater block 820 for heating substrate 816 to a desired temperature. Generally, substrate 816 is maintained at a temperature in a range of about from 25 degree C. to 500 degree C., preferably in a range of about from 350 degree C. to 425 degree C. to avoid thermal degradation of circuit components, such as a salicide layer.

Process gases/vapors are introduced via inlet 812. Multiple source gas lines 810 are connected to manifold 808. The gases/vapors may be premixed or not in the manifold. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 800 via an outlet 822. A vacuum pump 826 (e.g., a one or two stage mechanical dry pump and/or a turbomolecular pump) typically draws process gases out and maintains a suitably low pressure within the reactor by a close loop controlled flow restriction device, such as a throttle valve or a pendulum valve. In a method in accordance with the invention, pressures in the reaction chamber generally are maintained in a range of about from 0.1 Torr to 30 Ton, preferably in a range of about from 0.5-10 Ton.

In certain embodiments, a system controller 828 is employed to control process conditions during providing a PMOS transistor structure, forming a layer of salicide on at least the source and drain regions, depositing a amorphous carbon capping layer on the salicide, post deposition treatment, and other process operations. The controller will typically include one or more memory devices and one or more processors. The processor may include a CPU or computer, analog and/or digital input/output connections, stepper motor controller boards, etc.

In certain embodiments, the controller controls all of the activities of the reactor. The system controller executes system control software including sets of instructions for controlling the timing of the processing operations, frequency and power of operations of the LF generator 802 and the HF generator 804, flow rates and temperatures of precursors and inert gases and their relative mixing, temperature of the heater block 820, pressure of the chamber, and other parameters of a particular process. Other computer programs stored on memory devices associated with the controller may be employed in some embodiments.

Typically there will be a user interface associated with controller 828. The user interface may include a display screen, graphical software displays of the apparatus and/or process conditions, and user input devices such as pointing devices, keyboards, touch screens, microphones, etc.

The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the reactor.

The system software may be designed or configured in many different ways. For example, various chamber component subroutines or control objects may be written to control operation of the chamber components necessary to carry out the inventive deposition processes. Examples of programs or sections of programs for this purpose include substrate timing of the processing steps code, flow rates and temperatures of precursors and inert gases code, and a code for pressure of the chamber.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

EXAMPLE 1

The following example is provided to further illustrate aspects and advantages of the present invention. This example is provided to exemplify and more clearly illustrate aspects of the present invention and is in no way intended to be limiting.

An amorphous carbon capping layer film was deposited on the silicon substrates of a series of commercially-available silicon semiconductor wafers. The capping layer was deposited on each wafer using a PECVD process in all six RF stations of a Novellus Sequel apparatus. The deposition plasma conditions were the same for all wafers, and are summarized here for the Sequel apparatus as a whole.

The flow rates and the power values for each of the six RF stations corresponded to about one-sixth of the values listed below. Methane was used as a precursor with the flow rate of 200 sccm. The pressure in the reaction chamber was 6 Ton, and the temperature was 380° C. The helium flow rate is 8500 sccm; argon flow rate was 4000 sccm. Nitrogen was not used in the process. The power level of the HF generator was 100 W at 13.56 MHz kHz and of the LF generator was 300 W at 416 kHz. The resulting film had a residual compressive stress of 3.8 GPa. The process conditions for this specific example are also summarized in Table 1. The film contains essentially very low concentration of hydrogen.

TABLE 1

| Parameter | Parameter value |
|---|---|
| Apparatus | Novellus Sequel ™ 6 stations for 200 mm wafers |
| CH4 (sccm) | 200 |
| Inert Gas (Ar and He) (sccm) | 12,500 |
| LF Generator (W) | 300 |
| HF Generator (W) | 100 |
| Pressure (Torr) | 6 |
| Temperature (° C.) | 380 |

EXAMPLE 2

The following example is provided to further illustrate aspects and advantages of the present invention. This example is provided to exemplify and more clearly illustrate aspects of the present invention and is in no way intended to be limiting.

An amorphous carbon capping layer film was deposited on the silicon substrates of a series of commercially-available silicon semiconductor wafers. The capping layer was deposited on each wafer using a PECVD process in all four RF stations of a Novellus Vector apparatus. The deposition plasma conditions were the same for all wafers, and are summarized here for the Vector apparatus as a whole.

The flow rates and the power values for each of the four RF stations corresponded to about one-fourth of the values listed below. Methane was used as a precursor with the flow rate of 300 sccm. The pressure in the reaction chamber was 6 Torr and the temperature was 380° C. The helium flow rate is 21060 sccm; argon flow rate was 14480 sccm. Nitrogen was not used in the process. The power level of the HF generator was 100 W at 13.56 MHz kHz and of the LF generator was 250 W. The resulting film had a residual compressive stress of 5.2 GPa. The process conditions for this specific example are also summarized in Table 2. The film contains essentially very low concentration of hydrogen.

TABLE 2

| Parameter | Parameter value |
|---|---|
| Apparatus | Novellus Vector ™ 4 stations for 300 mm wafers |
| CH4 (sccm) | 300 |
| Inert Gas (Ar and He) (sccm) | 35,540 |
| LF Generator (W) | 250 |
| HF Generator (W) | 100 |
| Pressure (Torr) | 6 |
| Temperature (° C.) | 380 |

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of fabricating a semiconductor device, the method comprising:
   (a) providing a PMOS transistor structure comprising a substrate, a conductive gate separated from the substrate by a gate dielectric, source and drain regions in the substrate on either side of the gate, and a channel region underlying the gate;
   (b) forming a layer of salicide on the source and drain regions and on the conductive gate; and
   (c) depositing a compressive liner using dual-frequency PECVD, said compressive liner comprising an amorphous carbon film overlying at least the salicide layer, said carbon film characterized by a compressive residual stress.

2. The method of claim 1, wherein (c) comprises depositing the carbon film using a saturated hydrocarbon precursor.

3. The method of claim 1, wherein (c) comprises depositing the carbon film using an unsaturated hydrocarbon precursor.

4. The method of claim 1, wherein depositing the compressive liner using dual frequency PECVD comprising applying a high frequency (HF) RF power and a low frequency (LF) RF power.

5. The method of claim 1, wherein the compressive liner is deposited at a substrate temperature of less than about 425° C.

6. The method of claim 1, wherein the compressive liner is deposited at a substrate temperature of less than about 380° C.

7. The method of claim 1, wherein the carbon film is undoped.

8. The method of claim 1, wherein the compressive liner has a compressive stress of at least about 3.0 GPa.

9. The method of claim 1, wherein the compressive liner has a compressive stress of at least about 3.5 GPa.

10. The method of claim 1, wherein the compressive liner has a compressive stress of at least about 4.0 GPa.

11. The method of claim 1, wherein the compressive liner has a compressive stress of at least about 5.0 GPa.

12. The method of claim 1, wherein the deposition conditions for the compressive liner are defined within the following ranges:

| Parameter | Range |
|---|---|
| CH$_4$ (sccm) | 5-1000 |
| Inert gas (sccm) | 1000-30000 |
| LF RF (W) | 200-2000 at a frequency of 250-800 kHz |
| HFRF (W) | 50-1000 at a frequency of 2-20 MHz |
| Pressure (Torr) | 0.5-6 |
| Temperature (° C.) | $250 \leq X \leq 425$ |

13. The method of claim 2, wherein the saturated hydrocarbon precursor is methane.

14. The method of claim 3, wherein the unsaturated hydrocarbon precursor is acetylene.

15. The method of claim 3, wherein the unsaturated hydrocarbon precursor is ethylene.

16. The method of claim 4, wherein the LF RF power is applied at frequency of about 250-800 kHz.

17. The method of claim 4, wherein a ratio of a power level the LF RF power to a power level of the HF RF power is between about 1 and 10 during deposition of the carbon film.

* * * * *